US010818374B2

(12) United States Patent
Narayanan et al.

(10) Patent No.: US 10,818,374 B2
(45) Date of Patent: Oct. 27, 2020

(54) TESTING READ-ONLY MEMORY USING MEMORY BUILT-IN SELF-TEST CONTROLLER

(71) Applicant: TEXAS INSTRUMENTS INCORPORATED, Dallas, TX (US)

(72) Inventors: Prakash Narayanan, Bengaluru (IN); Nikita Naresh, Bengaluru (IN); Prathyusha Teja Inuganti, Bengaluru (IN); Rakesh Channabasappa Yaraduyathinahalli, Bengaluru (IN); Aravinda Acharya, Bengaluru (IN); Jasbir Singh, Bengaluru (IN); Naveen Ambalametil Narayanan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/271,660

(22) Filed: Feb. 8, 2019

(65) Prior Publication Data
US 2020/0135290 A1 Apr. 30, 2020

Related U.S. Application Data

(60) Provisional application No. 62/751,873, filed on Oct. 29, 2018, provisional application No. 62/785,953, filed on Dec. 28, 2018.

(51) Int. Cl.
*G11C 29/38* (2006.01)
*G11C 17/00* (2006.01)
(Continued)

(52) U.S. Cl.
CPC .......... *G11C 29/38* (2013.01); *G06F 12/0638* (2013.01); *G11C 11/005* (2013.01);
(Continued)

(58) Field of Classification Search
CPC . G11C 29/38; G11C 29/04; G11C 2029/0407; G11C 29/08; G11C 29/10;
(Continued)

(56) References Cited

U.S. PATENT DOCUMENTS 5,511,202 A * 4/1996 Combs .................. G06F 9/4418 713/323
6,081,752 A * 6/2000 Benson, IV .............. G06F 1/26 700/79

(Continued)

OTHER PUBLICATIONS

Smoot, Designing Built-in Test for Microprocessors, 1984, IEEE, pp. 412-415. (Year: 1984).*

*Primary Examiner* — John J Tabone, Jr.
(74) *Attorney, Agent, or Firm* — Ebby Abraham; Charles A. Brill; Frank D. Cimino

(57) ABSTRACT

A system includes a volatile storage device, a read-only memory (ROM), a memory built-in self-test (BIST) controller and a central processing unit (CPU). The CPU, upon occurrence of a reset event, executes a first instruction from the ROM to cause the CPU to copy a plurality of instructions from a range of addresses in the ROM to the volatile storage device. The CPU also executes a second instruction from the ROM to change a program counter. The CPU further executes the plurality of instructions from the volatile storage device using the program counter. The CPU, when executing the plurality of instructions from the volatile storage device, causes the ROM to enter a test mode and the memory BIST controller to be configured to test the ROM.

18 Claims, 4 Drawing Sheets

(51) Int. Cl.
  *G11C 29/00*  (2006.01)
  *G11C 11/00*  (2006.01)
  *G11C 29/10*  (2006.01)
  *G11C 29/12*  (2006.01)
  *G11C 29/04*  (2006.01)
  *G11C 29/08*  (2006.01)
  *G11C 14/00*  (2006.01)
  *G06F 12/06*  (2006.01)
  *G06F 9/4401*  (2018.01)

(52) U.S. Cl.
  CPC .......... *G11C 14/0054* (2013.01); *G11C 17/00* (2013.01); *G11C 29/04* (2013.01); *G11C 29/08* (2013.01); *G11C 29/10* (2013.01); *G11C 29/12* (2013.01); *G11C 29/822* (2013.01); *G06F 9/4401* (2013.01); *G11C 2029/0407* (2013.01)

(58) Field of Classification Search
  CPC ..... G11C 29/12; G11C 29/822; G11C 11/005; G11C 14/0054; G11C 17/00; G06F 9/4401; G06F 12/0638
  USPC .............. 714/718, 30, 36, 54, 742; 709/222; 710/10; 713/2
  See application file for complete search history.

(56) References Cited

U.S. PATENT DOCUMENTS 6,401,199 B1 * 6/2002 Klein .................... G06F 9/4401
                                                            709/222
2007/0233955 A1 * 10/2007 Luo ........................ G06K 19/07
                                                            711/115

* cited by examiner

TESTING READ-ONLY MEMORY USING MEMORY BUILT-IN SELF-TEST CONTROLLER

CROSS REFERENCE TO RELATED APPLICATIONS

This application claims priority to U.S. Provisional Application No. 62/751,873, filed Oct. 29, 2018, and U.S. Provisional Application No. 62/785,953, filed Dec. 28, 2018, which are hereby incorporated by reference in their entirety.

BACKGROUND

Many electronic systems include a microprocessor that executes code from memory. Such systems often include a read-only memory (ROM) and a random-access memory (RAM). A "boot" ROM may be included in the system to store code that is executed during a boot process for the system. Many systems test the RAM and ROM during the boot process and/or during idle times after the boot process has completed to confirm whether such memories are structurally intact and whether the data stored is reliable.

SUMMARY

In one example, a system includes a volatile storage device, a read-only memory (ROM), a memory built-in self-test (BIST) controller and a central processing unit (CPU). The CPU, upon occurrence of a reset event, executes a first instruction from the ROM to cause the CPU to copy a plurality of instructions from a range of addresses in the ROM to the volatile storage device. The CPU also executes a second instruction from the ROM to change a program counter. The CPU further executes the plurality of instructions from the volatile storage device using the program counter. The CPU, when executing the plurality of instructions from the volatile storage device, causes the ROM to enter a test mode and the memory BIST controller to be configured to test the ROM.

In another example, a method includes copying a plurality of instructions from a range of addresses within a read-only memory (ROM) to a volatile storage device, and changing a value of a program counter to correspond to an address within the volatile storage device at the beginning of the plurality of instructions. The method further includes executing the plurality of instructions from the volatile storage device. The instructions include an instruction to change the value of the program counter to correspond to an address within the ROM following the end of the plurality of instructions within the ROM. The method also includes executing an instruction within the ROM to determine whether the ROM passed a test.

BRIEF DESCRIPTION OF THE DRAWINGS

For a detailed description of various examples, reference will now be made to the accompanying drawings in which:

FIG. 4 shows another example of a system for testing a ROM.

DETAILED DESCRIPTION

As noted above, the contents of a ROM are validated during the boot process. A cyclic redundancy check (CRC) technique often is used to validate the contents of a ROM. CRC techniques are time-consuming, and some applications may have stringent timing requirements. In the case of automotive applications, for example, in which a circuit containing a ROM may be included, the ROM's contents need to be validated within a relatively minimal time window, particularly when the ROM is part of a safety critical circuit. For example, every time a driver turns on an automobile, one or more ROMs within the automobile may need to have their contents validated. However, the driver expects to be able to drive the automobile very soon after starting the automobile and have the automobile operate safely.

The examples described herein provide a circuit architecture for rapidly validating the contents of a ROM. The architecture includes a memory built-in self-test (MBIST) controller that tests both the RAM and ROM of the system. Early on during the boot process, the central processing unit (CPU) executes an instruction from the ROM that causes the CPU to copy certain instructions from the ROM to the RAM (or other type of volatile storage device). The CPU then continues execution of those particular instructions from the RAM. The copied instructions executed from RAM cause the CPU to transition the ROM to a test mode and cause the CPU to instruct the MBIST controller to test the ROM. By offloading the responsibility of ROM-testing to the MBIST controller, the CPU is available to perform other useful boot and initialization functions thereby expediting the boot process. Further, in some systems back-to-back read access by the CPU of the ROM is not possible, which makes testing the ROM slower than if back-to-back reads were possible. Further still, if a CRC process was used to test the ROM, computation cycles using the arithmetic logic unit (ALU) and registers of the CPU may include 10-15 cycles per each ROM location being tested. The architecture described herein tests the ROM in a more efficient and faster manner. The examples described herein pertain to the use of RAM to assist in testing the ROM, but other types of volatile storage devices can be used instead of RAM (e.g., registers).

Figure 1:
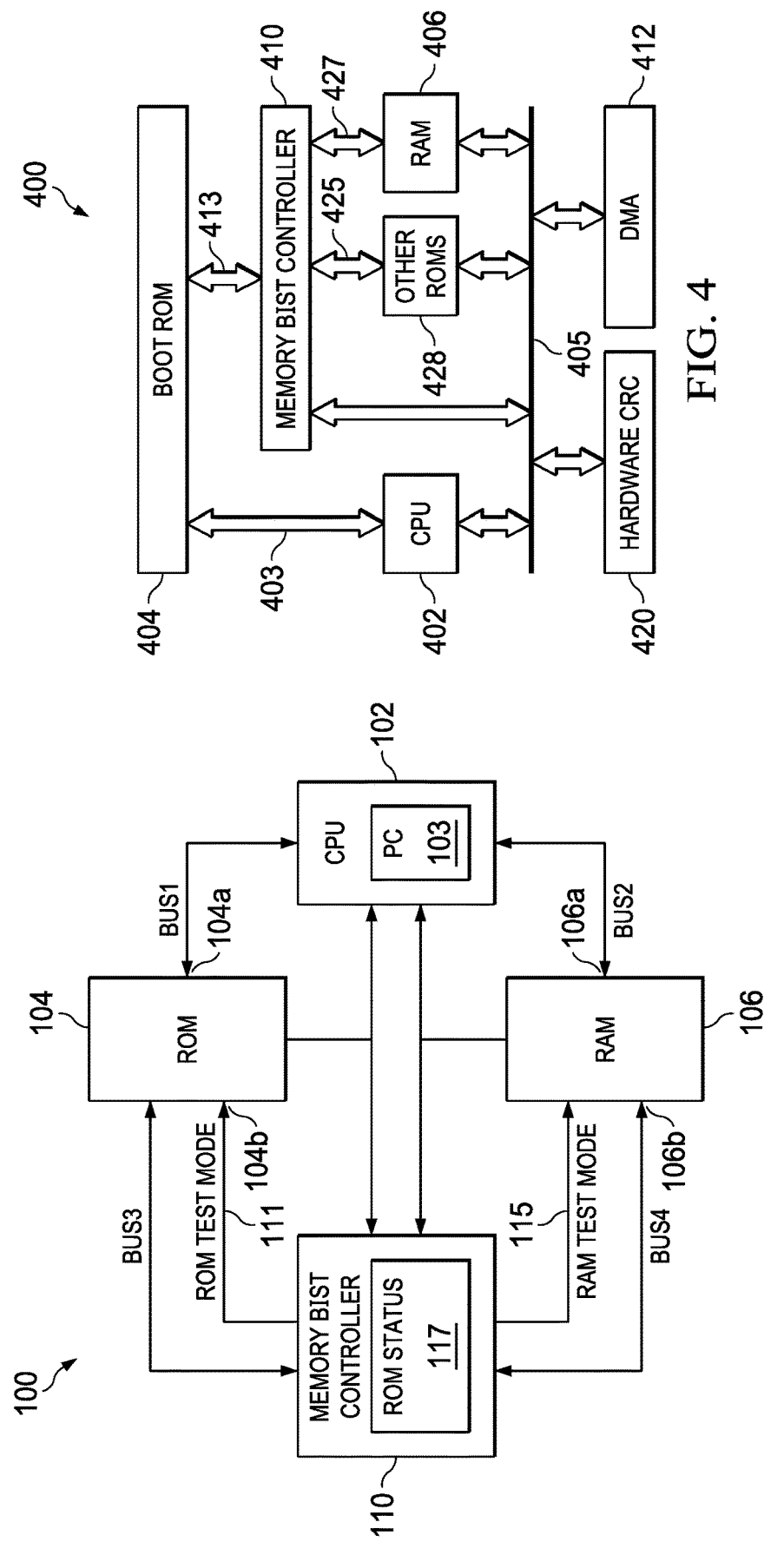
FIG. 1 illustrates an example system for testing a ROM.

FIG. 1 shows an example of a system 100 containing a CPU 102, ROM 104, RAM 106, and an MBIST controller 110. In one implementation, the system 100 comprises a system-on-chip (SoC) in which the components shown in FIG. 1 are fabricated on a common semiconductor die. The ROM 104 is a non-transitory storage device. While one CPU 102 is shown in this example, multiple CPUs may be included in other examples. The CPU 102 in this example can access the ROM 104 via an address and data bus (BUS1), and the CPU 102 can access the RAM 106 via a different address and data bus (BUS2). The CPU 102 executes code located at a memory location corresponding to a program counter (PC) 103. The value of the PC 103 either is the address in the RAM 106 or ROM 104 from which to fetch an instruction, or the value is used to derive the memory address (e.g., a value that is added to an offset to generate a memory address). Similarly, the MBIST controller 110 is communicatively coupled to the ROM 104 and RAM 106 via address and data buses BUS3 and BUS4, respectively.

Executable instructions (also referred to as "code") are stored in ROM 104 and can be retrieved therefrom for execution by the CPU 102. The code may comprise boot code which is executed upon a reset of the system 100 (e.g., hard or soft reset). The boot code may cause the CPU 102 to perform various initialization functions such as configuring various registers, testing interfaces that are present in the system, etc. RAM 106 can be used as scratchpad storage for temporary storage of data or code used during run-time. Code from ROM 104 can be transferred to RAM 106 for execution from RAM 106.

The RAM 106 may comprise one or more memory devices and is a dual-ported memory device. Via one port 106a, the CPU 102 can access RAM 106. Via another port 106b, the MBIST controller 110 can access RAM 106. A RAM TEST MODE signal 115 can be asserted to a first logic state to cause the RAM 106 to be in a first execution mode (referred to as a "run-time execution mode") in which the CPU 102 is able to use the RAM 106, or in a second logic state to cause RAM 106 to be in a second mode (referred to as a "test mode") in which the MBIST controller 110 is able to access the RAM. In the run-time execution mode, port 106a is active (and port 106b is inactive) to allow the CPU 102 to access the RAM 106 via BUS2. In the test mode, port 106b is active (and port 106a is inactive) to allow the MBIST controller 110 to access the RAM via BUS4. While in its test mode, the MBIST controller 110 can test the RAM 106. For example, via BUS4 the MBIST controller 110 can write a predefined bit pattern to the RAM 106, and then read the RAM to confirm that the read data matches what was written to the RAM. In one example, the CPU 102 writes one or more control registers in the MBIST controller 110 to trigger the MBIST controller 110 to begin testing the RAM 106.

The ROM 104 also is a dual-ported memory device and includes ports 104a and 104b. Port 104a is coupled to the CPU 102 and port 104b is coupled to the memory BIST controller 110. Similar to the RAM 106, a ROM TEST MODE 111 can be asserted to a first logic state by the memory BIST controller 110 to cause the ROM 104 to be in a "run-time" execution mode in which the CPU 102 is able to access the ROM 104 (e.g., to fetch code), or in a second logic state to cause ROM 104 to be in a "test mode" in which the MBIST controller 110 is able to access the ROM. In the run-time execution mode, port 104a is active (and port 104b is inactive) to allow the CPU 102 to access the ROM 104 via BUS1. In the test mode, port 104b is active (and port 104a is inactive) to allow MBIST controller 110 to access the ROM 104 via BUS3.

Figure 2:
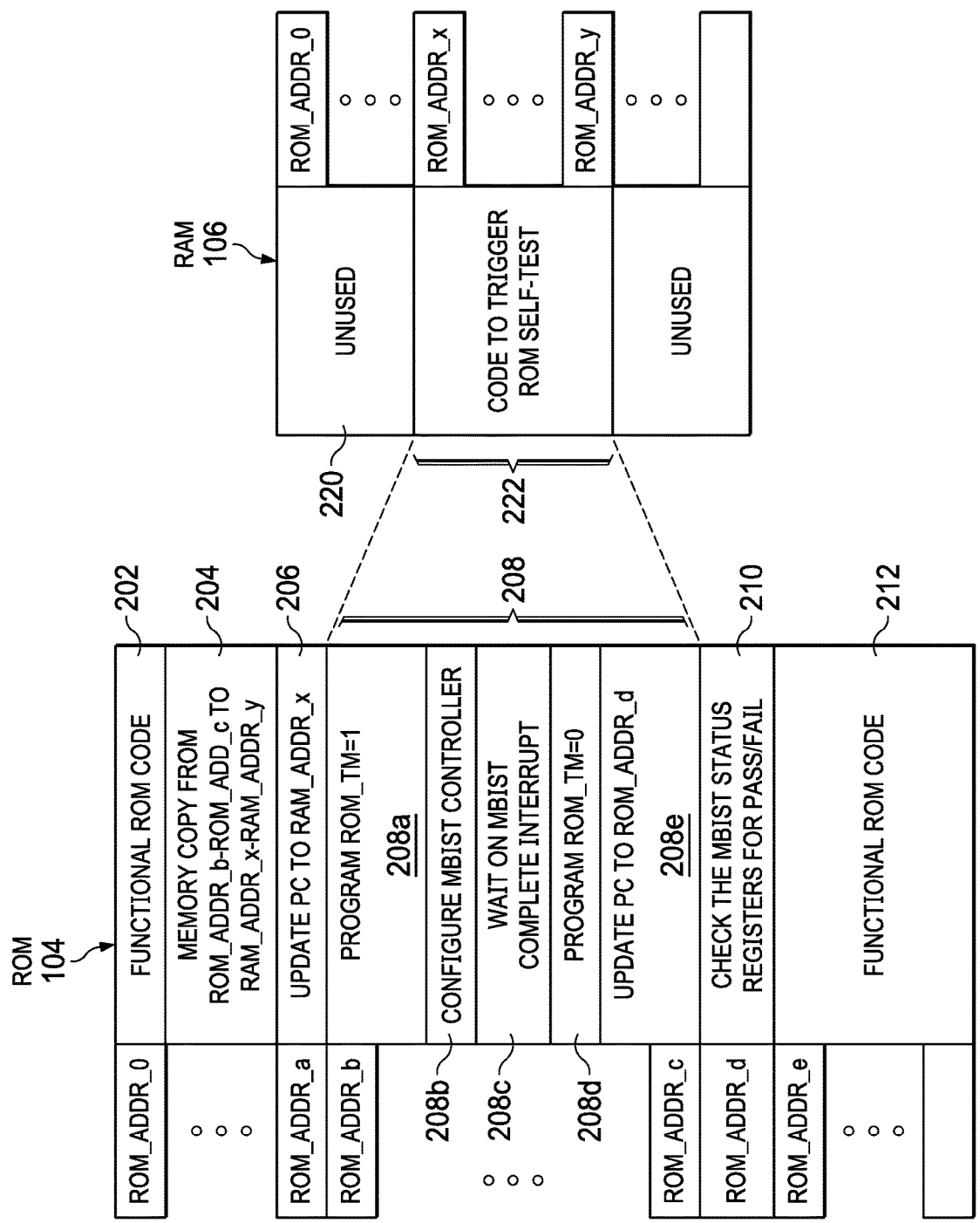
FIG. 2 illustrates copying code from the ROM to a RAM for execution therefrom to initiate testing of the ROM by a memory built-in self-test (MBIST) controller.

To test the ROM 104, the example procedure described in FIG. 2 can be performed. Turning to FIG. 2, the contents of at least portions of the ROM 104 and the RAM 106 are shown. The ROM 104 includes executable code 202, 204, 206, 208, 210, and 212. Code 202 and 212 comprise functional ROM code to assist in booting the system as well as assisting to operate the system during run-time (e.g., providing access to low-level hardware components on behalf of higher level applications). During the boot process, the CPU 102 begins executing functional ROM code 202 beginning, for example, at ROM_ADDR_0. That is, program counter 103 is loaded with a value that corresponds to ROM_ADDR_0 and the CPU 102 begins executing instructions at that address within the ROM. The PC 103 is incremented for each code instruction (or group of instructions) fetched from ROM 104.

The PC 103 will eventually be a value that corresponds to the location of code 204 within the ROM 104. Code 204 comprises an instruction that causes the CPU 102 to copy ROM code 208 from addresses ranging between ROM_ADDR_b and ROM_ADDR_c to RAM addresses ranging between RAM_ADDR_x and RAM_ADDR_y as shown by the dashed lines. The portion of the RAM 106 that is used to receive ROM code 208 is an otherwise unused portion 220 of the RAM. The ROM code 208 received into the RAM 106 is shown as RAM code 222 in FIG. 2.

Once the ROM code 208 is copied to the RAM 106, the PC is again incremented to ROM_ADDR_a. The code at that location causes the CPU 102 to change the PC 103 to a value that corresponds to the RAM address RAM_ADDR_x (the beginning address of RAM code 222, which contains code 208 from ROM 104). The CPU 102 then executes the instructions of ROM code 208, but executes a copy of those instructions from the RAM (code 222). The instructions comprise instructions 208a-208d. Instruction 208a causes the CPU 102 to configure the ROM 104 for the test mode. In one example, configuring the ROM 104 for the test mode comprises the memory BIST controller 110 asserting ROM TEST MODE signal 111 (FIG. 1) to the logic state which causes the ROM 104 to enter its test mode in which its port 104b is enabled (and port 104a is disabled). Instruction 208b is then executed to cause the CPU 102 to configure the MBIST controller 110 to test the ROM 104. In one example, the CPU 102 writes one or more control registers in the MBIST controller 110 to trigger the MBIST controller 110 to begin testing the ROM 104. Any suitable non-volatile memory test process can be used to test the ROM 104.

The CPU 102 then executes instruction 208c to cause the CPU 102 to enter a pause state as to wait for the MBIST controller 110 to complete its testing of the ROM 104. Once the MBIST controller 110 completes its ROM testing process, the MBIST controller 110 may assert an interrupt to the CPU 102 to signal the CPU that the ROM test has completed. The CPU 102 exits the pause state and then executes instruction 208d which causes the CPU 102 to take the ROM 104 out of its test mode and place into the run-time execution mode to thereby permit the CPU 102 to again retrieve instructions from the ROM via port 104a. This action may be implemented by the MBIST controller changing the logic state of the ROM TEST MODE signal 111 to a logic state corresponding to the run-time execution mode in which port 104a is enabled and port 104b is disabled. Instruction 208e from RAM 106 is then executed which causes the CPU to change the PC 103 to a value corresponding to ROM_ADDR_d, which is the ROM address following code 208 that was previously copied to RAM 106.

The MBIST controller 110 includes a ROM status register 117 which contains a value indicative of the result of the ROM test. In one example, the ROM status register includes a pass/fail indication. With the newly changed PC 103 back to a value corresponding to ROM_ADDR_d, the CPU 102 then fetches instructions from ROM 104 instead of RAM 106. Instruction 210 is thus fetched and causes the CPU 102 to check the MBIST status register 117 for the results of the ROM test. Instruction 210 further may cause code execution to continue in the functional ROM code 212 if the ROM 104 passed its test. If the ROM 104 did not pass its test, instruction 210 may initiate an error response. Examples of error response include the generation of an interrupt to the CPU 102, the assertion of an output signal by an error state machine, etc.

Figure 3:
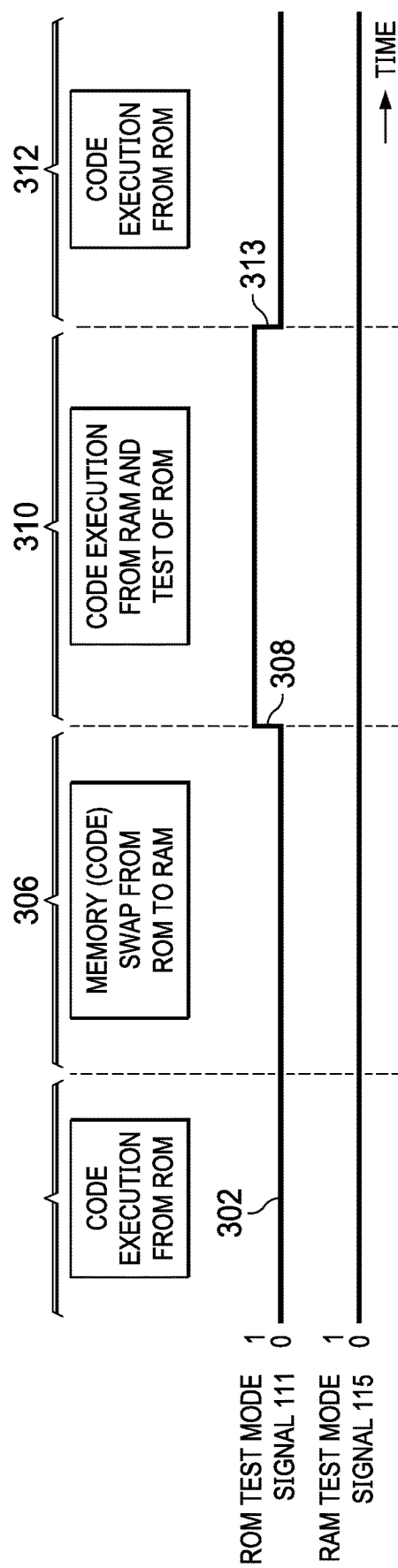
FIG. 3 illustrates a timeline for testing the ROM using the MBIST controller.

FIG. 3 provides an example of a timeline illustrating how the ROM 104 is tested. Either before or after the RAM 106 is tested by the MBIST controller 110 (and thus RAM TEST MODE signal 115 is in a logic state such as logic "0" in the example of FIG. 3), the ROM TEST MODE signal 111 is in a logic state ("0" in FIG. 3 as shown at 302) corresponding to the ROM's run-time execution mode to permit the CPU 102 to fetch code from ROM 104 for execution. At 306, the code 208 is copied by the CPU 102 from the ROM 104 to the RAM 106. The logic state of the ROM TEST MODE signal 111 is then changed to a state to place the ROM 104 in the test mode (logic "1" in this example) to permit the MBIST controller 110 to access port 104b for test purposes. The copied ROM code 208 (now in RAM 106) is executed from the RAM. The copied ROM code 208 causes the CPU 102 to perform the operations explained above, such as configure the MBIST controller 110 to test the ROM 104. At 313, the ROM TEST MODE signal 111 is then asserted back to its former state in which the ROM 104 is placed back in its run-time execution mode so that code fetching can continue from ROM 104 and execution by the CPU 102 at 312.

FIG. 4 is an example architecture of a system 400 implementing the ROM-testing paradigm explained above. The example system 400 includes a CPU 402 (which may comprise an ARM core), a boot ROM 404, RAM 406, and an MBIST controller 410. System 400 in the example of FIG. 4 includes additional components as well such as a direct memory access (DMA) controller 412, additional ROMs 428, and a hardware CRC 420. The CPU 402, DMA 412, MBIST controller 410, hardware CRC 420, ROMs 428, and RAM 406 are coupled together via bus 405. In one example, bus 405 comprises an Advanced Extensible Interface (AXI), but can comport with other standards in other implementations. Boot ROM 404 (which contains the ROM code shown in FIG. 2) is coupled to the CPU 402 via a Tightly Coupled Memory (TCM) interface (an ITCM and a DTCM). The MBIST controller 410 is coupled to boot ROM 404, ROMs 428 and RAM 406 via interfaces 413, 425, and 427, respectively, as shown. The operations performed by the CPU 102 and MBIST controller 110 relative to ROM 104 and RAM 106 of FIG. 1 are performed by CPU 402 and MBIST controller 410 relative to ROM 404 and RAM 406 of FIG. 4.

Figure 5:
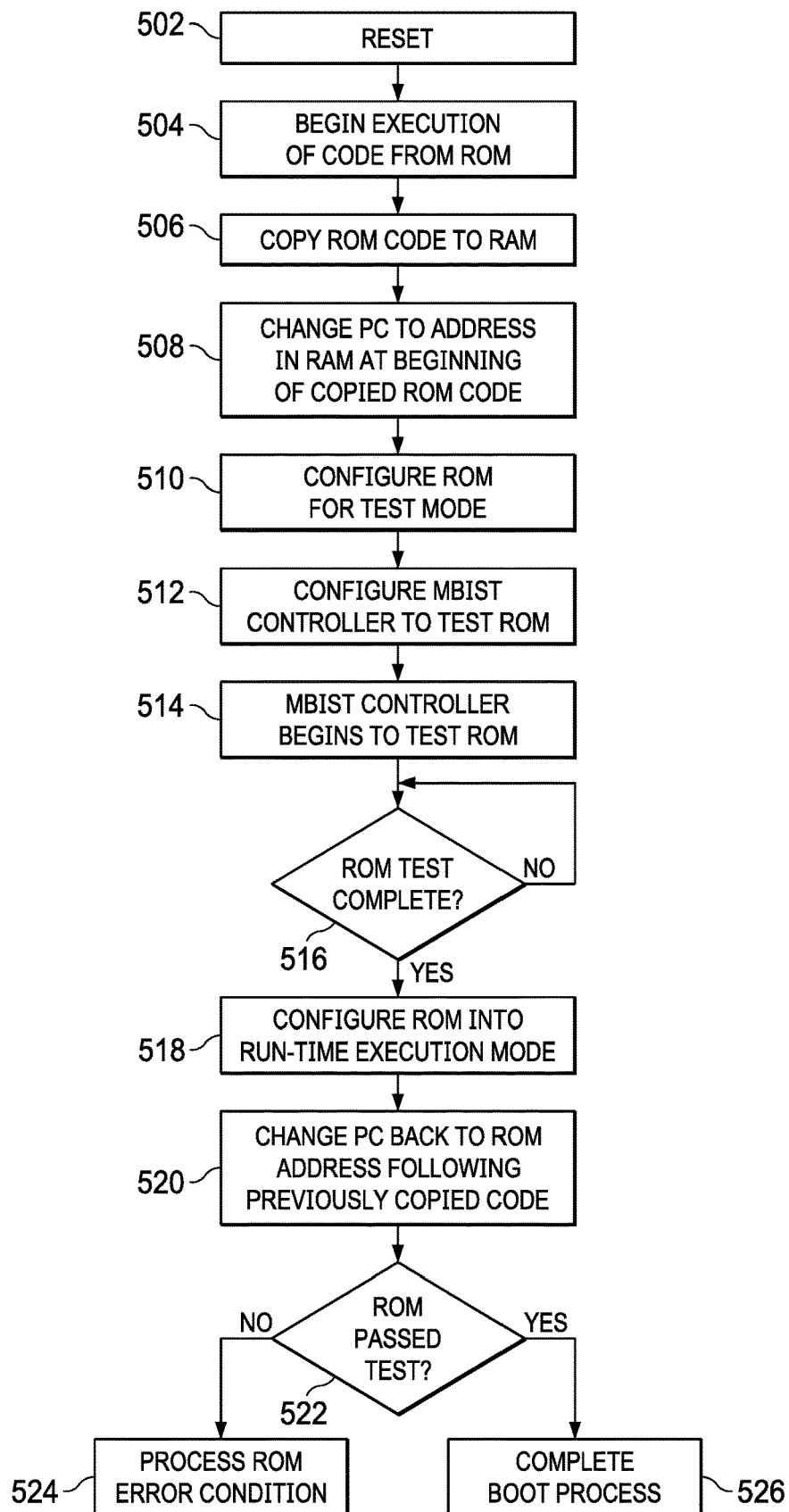
FIG. 5 is a flow chart of a method for testing the ROM.

FIG. 5 shows a flow chart of a method in accordance with an example. The operations can be performed in the order shown, or in a different order. Further, the operations can be performed sequentially, or two or more of the operations may be performed concurrently.

At 502, a reset event occurs. Power to the system 100, 400 can be enabled or a soft or hard reset event may occur. At 504, the CPU begins executing code from the ROM (e.g., ROM 104, ROM 404). One of the ROM instructions causes the CPU at 506 to copy a portion of the ROM's code to RAM. The PC is changed at 508 to correspond to an address in RAM corresponding to the beginning of the copied ROM code. The CPU then begins to execute the copied code from the RAM and, in so doing, configures the ROM into the test mode at 510. The MBIST controller (e.g., MBIST controller 110, 410) is configured by the CPU to test the ROM at 512, and the MBIST controller then begins to test the ROM (514).

The CPU waits at 516 for the MBIST controller to complete the ROM test. Once the ROM test is complete, at 518 the ROM is configured back into its run-time execution mode to permit the CPU to continue fetching instructions from the ROM. The PC is changed to an address in ROM following the previously copied ROM code (520). At 522, the method includes determining whether the ROM passed the test. This operation may comprise the CPU reading the value (e.g., pass/fail flag) in a register. If the ROM passed its test, then the method continues at 526 in which the boot process is finished and the system enters its run-time environment (e.g., one or more run-time applications are executed). If, however, the ROM is determined not to have passed its test, then at 524, the ROM error is processed in a suitable manner such as that described above.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Modifications are possible in the described embodiments, and other embodiments are possible, within the scope of the claims.

What is claimed is:

1. A system, comprising:
a volatile storage device;
a read-only memory (ROM);
a memory built-in self-test (BIST) controller; and
a central processing unit (CPU) configured to in response to an initialization event, copy a plurality of instructions from a range of addresses in the ROM to the volatile storage device; and
instruct the ROM to enter a test mode and the memory BIST controller to be configured to test the ROM.

2. The system of claim 1, wherein:
the ROM has a first port coupled to the CPU and the ROM has a second port coupled to the memory BIST controller; and
when the CPU instructs the ROM to enter the test mode, the ROM disables the first port and enables the second port.

3. The system of claim 1, wherein the CPU is further configured to instruct the ROM to exit the test mode.

4. The system of claim 3, wherein the CPU is further configured to instruct the ROM to exit the test mode upon the memory BIST controller completing the test of the ROM.

5. The system of claim 3, wherein upon causing the CPU is configured to instruct the ROM to enable a first port of the ROM and disable a second port of the ROM.

6. The system of claim 1, wherein the CPU is further configured to change the program counter to a new value corresponding to an address in the ROM.

7. The system of claim 6, wherein the new value of the program counter corresponds to a ROM address following the range of addresses of the first plurality of instructions.

8. The system of claim 7, wherein the CPU is further configured to determine whether the ROM passed its testing by the memory BIST controller.

9. A non-transitory storage device storing instructions, which when executed by a central processing unit (CPU), causes the CPU to:
copy a plurality of instructions from a range of addresses within the non-transitory storage device to a volatile storage device;
alter a program counter to correspond to an address in the volatile storage device; and
determine whether the non-transitory storage device has passed a test performed by a second device.

10. The non-transitory storage device of claim 9, wherein the second device comprises a built-in self-test controller.

11. The non-transitory storage device of claim 9, wherein the instructions further cause the CPU to instruct the non-transitory storage device to disable a port to be coupled to the CPU and enable a port to be coupled to the second device.

12. The non-transitory storage device of claim 9, wherein the instructions further cause the CPU to instruct the second device to be configured to test the non-transitory storage device.

13. The non-transitory storage device of claim 9, wherein the instructions further cause the CPU to enable the port to be coupled to the CPU and to disable the port to be coupled to the second device.

14. The non-transitory storage device of claim 9, wherein the instructions further cause the CPU to change the program counter to correspond to an address in the ROM.

15. A method, comprising:
    copying a plurality of instructions from a range of addresses within a read-only memory (ROM) to a volatile storage device;
    changing a value of a program counter to correspond to an address within the volatile storage device at the beginning of the plurality of instructions;
    alter the value of the program counter to correspond to an address within the ROM; and
    determining whether the ROM passed a test.

16. The method of claim 15, further comprising performing the test of the ROM by a memory built-in self-test controller.

17. The method of claim 15, further comprising instructing to disable a first port of the ROM coupled to a central processing unit and enable a second port of the ROM coupled to a memory built-in self-test controller.

18. The method of claim 17, further comprising, upon completion of the test of the ROM, instructing the ROM to enable the first port of the ROM and disable the second port of the ROM.

\* \* \* \* \*